(12) United States Patent
Frizzell, Jr. et al.

(10) Patent No.: US 7,351,115 B1
(45) Date of Patent: Apr. 1, 2008

(54) METHOD FOR MODIFYING AN ELECTRICAL CONNECTOR

(75) Inventors: Raymond F. Frizzell, Jr., Staatsburg, NY (US); Arch F. Nuttall, Hyde Park, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/623,820

(22) Filed: Jan. 17, 2007

(51) Int. Cl.
*H01R 13/502* (2006.01)

(52) U.S. Cl. ......................................... 439/701; 29/847

(58) Field of Classification Search ................. 439/79, 439/608, 701; 29/842–844, 846, 847, 850
See application file for complete search history.

(56) References Cited

U.S. PATENT DOCUMENTS

| | | | |
|---|---|---|---|
| 4,438,561 A | | 3/1984 | Mueller |
| 4,731,704 A | | 3/1988 | Lochner |
| 4,864,723 A | | 9/1989 | Griffith et al. |
| 5,077,891 A | | 1/1992 | Lychyk et al. |
| 5,214,250 A | | 5/1993 | Cayson et al. |
| 5,493,076 A | | 2/1996 | Levite et al. |
| 5,543,584 A | | 8/1996 | Handford et al. |
| 5,615,387 A | | 3/1997 | Crockett, Jr. et al. |
| 5,834,705 A | | 11/1998 | Jonaidi |
| 6,231,354 B1 | | 5/2001 | Church et al. |
| 6,397,188 B1 | * | 5/2002 | Iwasawa ..................... 704/275 |
| 6,431,914 B1 | * | 8/2002 | Billman ....................... 439/608 |
| 6,435,814 B1 | * | 8/2002 | Yu et al. ...................... 415/115 |
| 6,554,647 B1 | * | 4/2003 | Cohen et al. ................ 439/607 |
| 6,808,420 B2 | * | 10/2004 | Whiteman et al. .......... 439/608 |
| 6,905,368 B2 | * | 6/2005 | Mashiyama et al. ........ 439/608 |
| 7,118,391 B2 | * | 10/2006 | Minich et al. ................. 439/79 |
| 7,131,870 B2 | * | 11/2006 | Whiteman et al. .......... 439/608 |
| 7,172,461 B2 | * | 2/2007 | Davis et al. ................. 439/608 |
| 7,182,643 B2 | * | 2/2007 | Winings et al. ............. 439/608 |
| 7,195,497 B2 | * | 3/2007 | Hull et al. ..................... 439/79 |
| 2006/0166528 A1 | * | 7/2006 | Hull et al. ..................... 439/79 |
| 2006/0276081 A1 | * | 12/2006 | Cohen et al. ................ 439/608 |
| 2007/0004282 A1 | * | 1/2007 | Cohen et al. ................ 439/608 |
| 2007/0021004 A1 | * | 1/2007 | Laurx et al. ................. 439/608 |
| 2007/0099507 A1 | * | 5/2007 | Ohnishi et al. .............. 439/608 |
| 2007/0117460 A1 | * | 5/2007 | Minich ......................... 439/608 |
| 2007/0117461 A1 | * | 5/2007 | Scharf ......................... 439/608 |

(Continued)

*Primary Examiner*—Ross Gushi
(74) *Attorney, Agent, or Firm*—John E. Campbell; Stephen Bongini; Fleit Kain Gibbons Gutman Bongini & Bianco P.L.

(57) ABSTRACT

A method is provided for modifying an electrical connector that is attached to a printed circuit board. On a wafer module of the electrical connector, a covering material is removed from an attachment area that is located above a signal pathway, and there is removed a connector pin that is connected to the signal pathway. A first end of a wire is attached to the attachment area of the wafer module to electrically connect to the signal pathway. The wire is run through a corresponding through-hole on the printed circuit board and the wafer module is inserted into an empty slot on the electrical connector. A second end of the wire is electrically connected to the printed circuit board or another wafer module. Also provided is an electronic assembly having a wire having a first end attached to a signal pathway of a wafer module of an electrical connector and a second end connected to a printed circuit board or another wafer module.

10 Claims, 7 Drawing Sheets

U.S. PATENT DOCUMENTS

2007/0155241 A1* 7/2007 Lappohn .................... 439/608
2007/0202746 A1* 8/2007 Ngo ........................... 439/608
2007/0202747 A1* 8/2007 Sharf et al. ................. 439/608
2007/0207641 A1* 9/2007 Minich ....................... 439/79
2007/0218765 A1* 9/2007 Cohen et al. ............... 439/608

* cited by examiner

METHOD FOR MODIFYING AN ELECTRICAL CONNECTOR

FIELD OF THE INVENTION

The present invention relates to electrical connectors, and more particularly relates to a method of reconfiguring a signal pathway by modifying an electrical connector.

BACKGROUND OF THE INVENTION

Connectors are commonly used for joining together electronic assemblies, such as Printed Circuit Boards (PCBs). One particular type of connector is formed by several wafer modules arranged side by side, with each module including multiple conductive pins which are press-fitted into corresponding plated holes of the circuit board. Connectors of this type are known as very high density metric (or "VHDM") connectors. VHDM connectors are modular in that they are constructed with wafers that can be removed and replaced after the connector has been installed on the circuit board. VHDM connectors provide a high-density solution that allows designers to grow their system horizontally by creating traditional backplane components in a right-angle orientation. VHDM connectors provide interfacing directly to the edge of the circuit board to which they are attached.

An example of a typical VHDM connector is shown in FIG. 1. The VHDM connector 100 is modular, in that it is comprised of a row of wafer modules 102a-d. The wafer modules 102a-d can be removed and replaced after the connector 100 is installed on a circuit board. FIG. 2 shows the VHDM connector 100 with two wafer modules 102m and 102n removed from slots 202 and 204, respectively.

There are circumstances in which it is desirable to re-route a signal pathway on a printed circuit board. For instance, during testing, a software verification group may need a way to introduce hardware "bugs" to determine if their code handles errors correctly. Unfortunately, pin-to-pin connections are dependent solely on the design of the circuit board to which the connector is attached. The only way to re-route a signal to a different connector pin is to modify the circuit board. However, such circuit wiring changes become difficult once a circuit board has been designed and built, and generally require removing the connector, drilling plated thru-holes (PTHs), epoxy filling and re-drilling (to isolate the pin from the circuit board), and reinstalling a connector. Other changes to the design may require sending the signal directly to a location on the board. Drawbacks of this approach include permanent modification to the circuit board and the risk of damage to other areas on the circuit board.

SUMMARY OF THE INVENTION

One embodiment of the present invention provides a method for modifying an electrical connector that is attached to a printed circuit board. On a wafer module of the electrical connector, a covering material is removed from an attachment area that is located above a signal pathway, and there is removed a connector pin that is connected to the signal pathway. The connector pin corresponds to a through-hole on the printed circuit board. A first end of a wire is attached to the attachment area of the first wafer module so as to electrically connect the wire and the signal pathway. The wire is run through the corresponding through-hole on the printed circuit board and the first wafer module is inserted into an empty slot on the electrical connector. A second end of the wire is electrically connected to the printed circuit board or another wafer module of the electrical connector.

Another embodiment of the present invention provides an electronic assembly that includes a printed circuit board, an electrical connector attached to the printed circuit board, and a wire. A first end of the wire is attached to a signal pathway of one of the wafer modules of the electrical connector so as to electrically connect the wire and the signal pathway. The wire passes through a through-hole on the printed circuit board that corresponds to the signal pathway, and a second end of the wire is electrically connected to the printed circuit board or another of the wafer modules of the electrical connector.

BRIEF DESCRIPTION OF THE DRAWINGS

The accompanying figures, where like reference numerals refer to identical or functionally similar elements throughout the separate views and which together with the detailed description below are incorporated in and form part of the specification, serve to further illustrate various embodiments and to explain various principles and advantages all in accordance with the present invention.

DETAILED DESCRIPTION

As required, detailed embodiments of the present invention are disclosed herein; however, it is to be understood that the disclosed embodiments are merely exemplary of the invention, which can be embodied in various forms. Therefore, specific structural and functional details disclosed herein are not to be interpreted as limiting, but merely as a basis for the claims and as a representative basis for teaching one skilled in the art to variously employ the present invention in virtually any appropriately detailed structure. Further, the terms and phrases used herein are not intended to be limiting; but rather, to provide an understandable description of the invention.

The present invention, according to a preferred embodiment, provides a method of modifying an electrical connector wafer module so as to allow one or more signal pathways to be re-routed to different nodes on a printed circuit board without the need to permanently modify the circuit board to which it is connected. This allows the board and the electrical connector to be restored to its original configuration. In the context of the present invention, a "signal pathway" can carry any electrical signal including, but not limited to, a digital signal, an analog signal, a power supply voltage, and a reference voltage.

Figure 1:
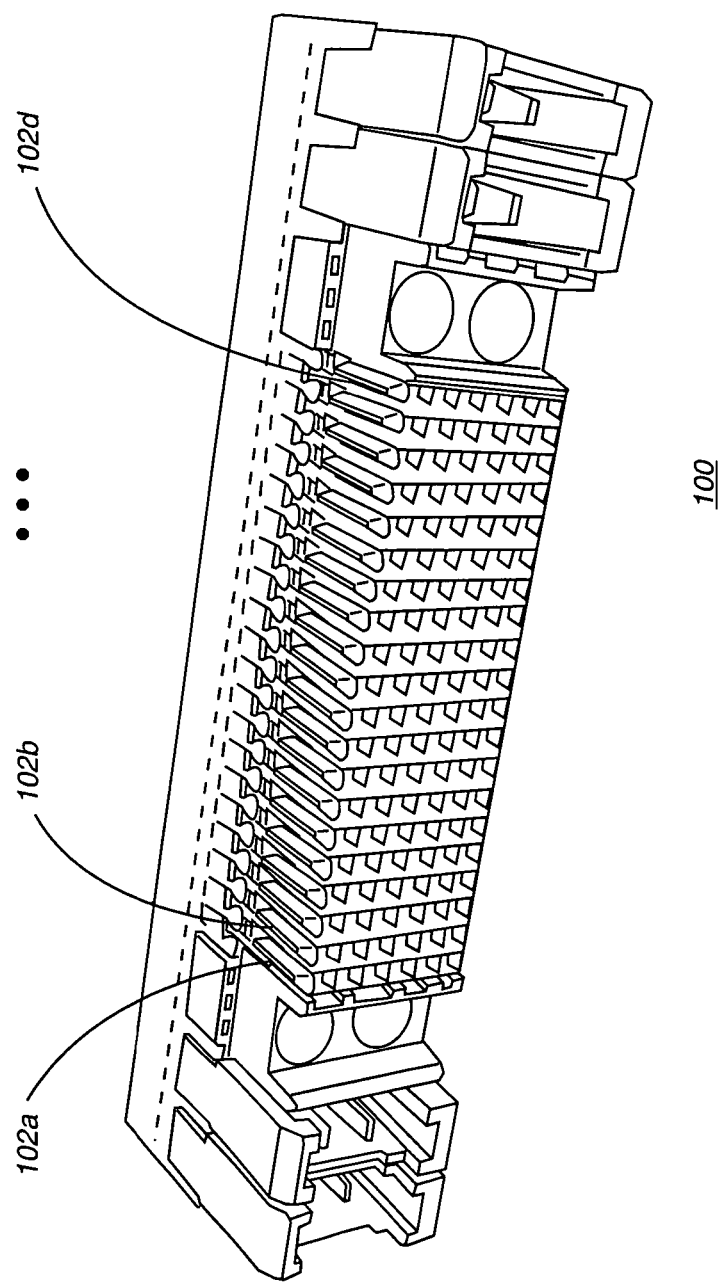
FIG. 1 is a side elevational view of a VHDM connector.
Figure 2:
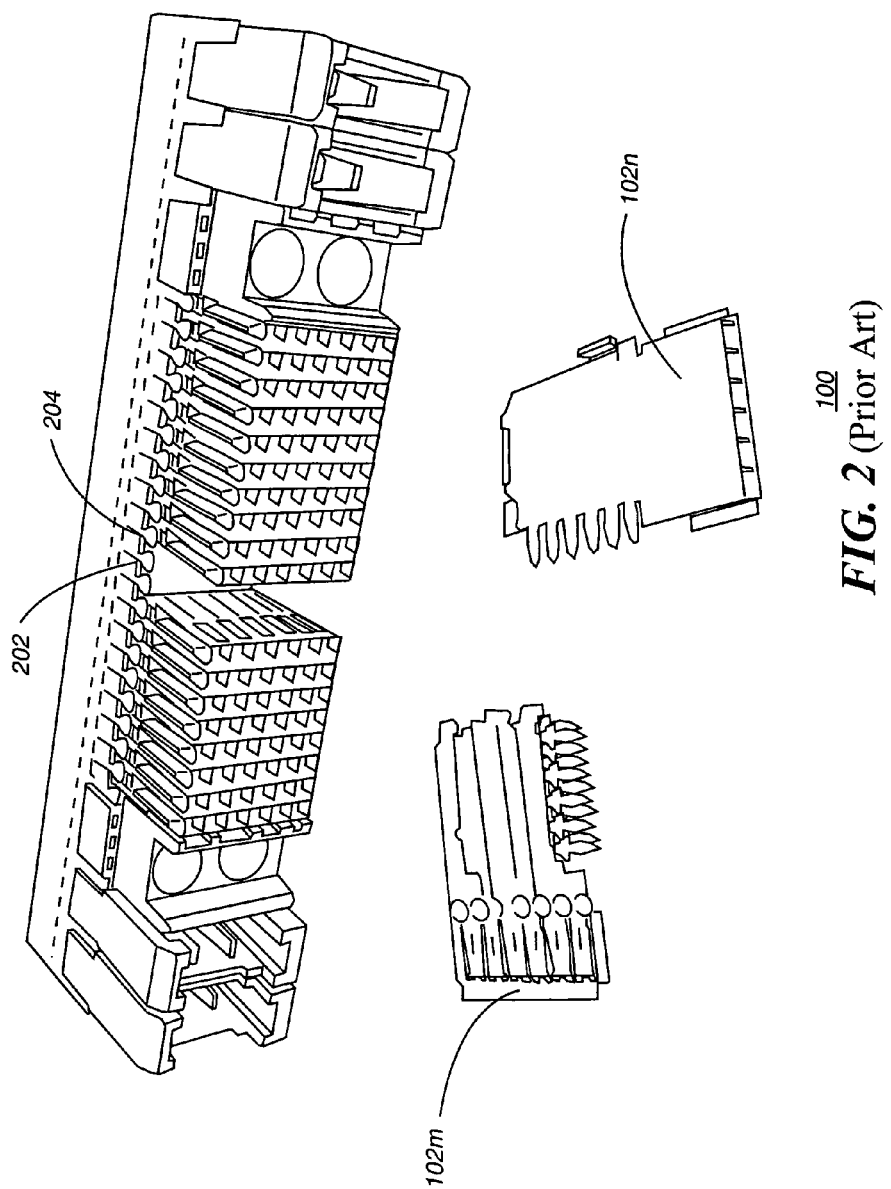
FIG. 2 is a side elevational view of the VHDM connector of FIG. 1 with two wafer modules removed.
Figure 3:
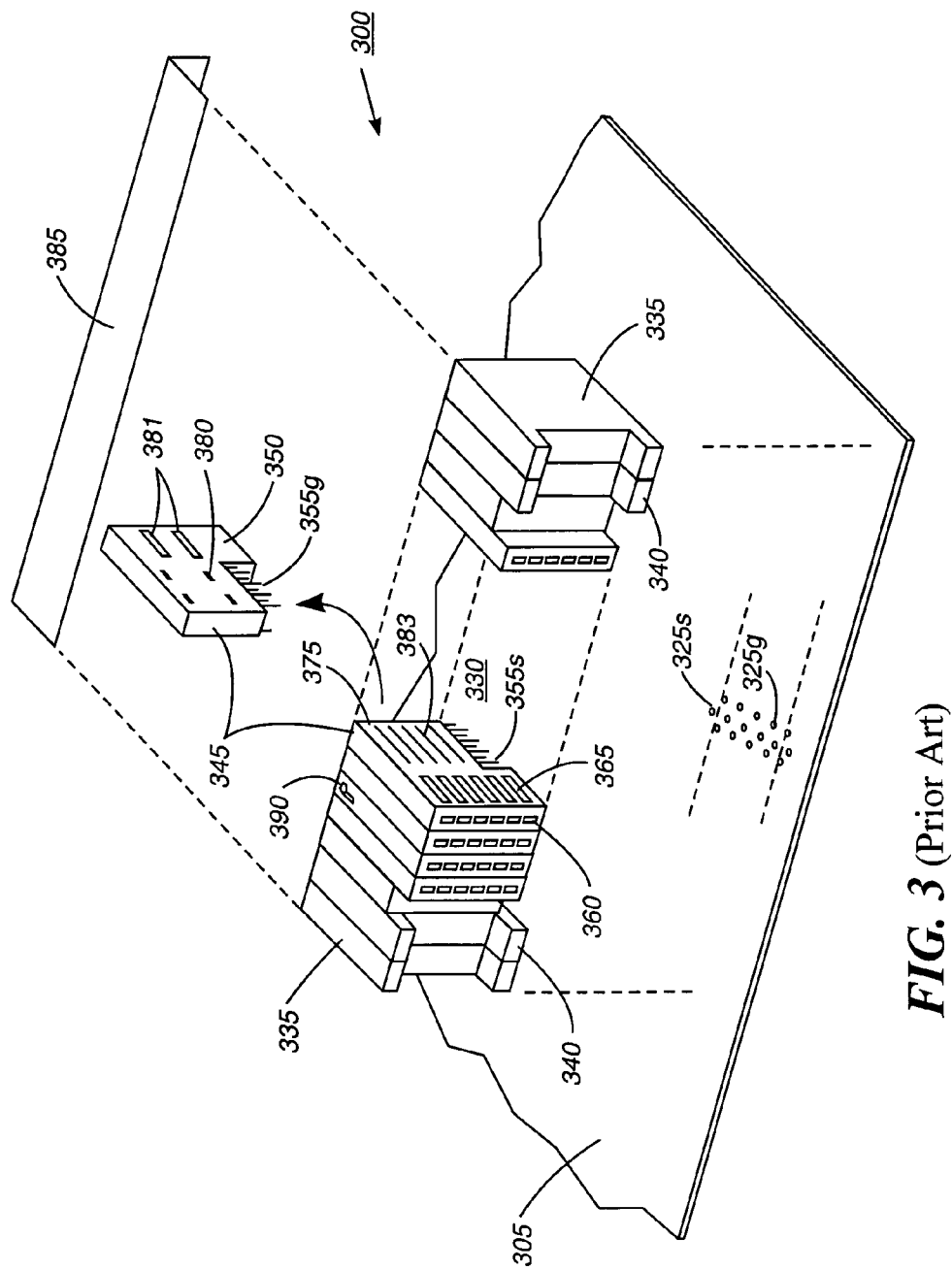
FIG. 3 is an exploded view of an exemplary electronic assembly including a VHDM connector.

FIG. 3 shows an exemplary electronic assembly 300 formed by a printed circuit board 305, which includes an insulating substrate with one or more conductive layers, and several electronic devices that are mounted on the circuit board.

A matrix of plated through-holes is formed in the circuit board 305. The matrix of this exemplary embodiment is comprised of columns with six holes 325$s$ for transmitting electrical signals, and columns with five holes 325$g$ connected to a reference terminal (or ground). The columns of ground holes 325$g$ are arranged in a staggered manner between each two columns of signal holes 325$s$. The matrix of signal holes 325$s$ and ground holes 325$g$ are aligned along a front edge of the circuit board 305.

A female VHDM press-fit connector 330 is attached to the circuit board 305. The VHDM connector 330 comprises a stack of wafer modules 345 (typically in multiples of 10 or 25) which are arranged side by side. The VHDM connector 330 of this embodiment also includes multiple power modules 335 and 340.

Each wafer module 345 comprises an insulating body 350 made of plastic material. The insulating body 350 holds a column with six signal pins 355$s$ and a parallel column with five ground pins 355$g$, for insertion into a corresponding column of signal holes 325$s$ and a corresponding column of ground holes 325$g$, respectively. The ground pins 355$g$ are staggered with respect to the signal pins 355$s$. Each of the pins extends downward from the insulating body 350 and comprises a metal blade with a compliant structure defined by a central hole.

Six receptacles 360 for insertion of mating pins of a male connector are arranged on a front edge of the insulating body 350. Each of the receptacles 360 houses a conductive fork 365 that is provided on a front side of the module 345 and connected to a respective signal pin 355$s$. The forks 365 and signal pins 355$s$ extend at right angles relative to one another. Each of the forks 365 is formed by a pair of opposed cantilever beams, which act as a spring to exert pressure on the inserted pin of the male connector. A ground plane 370 is provided on a rear side of the module 345, and is connected to all of the ground pins 355$g$. In this way, each row of signal pins 355$s$ is sandwiched between two adjacent ground planes 370, which define a stripline shielding for reducing undesirable interactions between adjacent columns of signal pins 355$s$.

The front side of module 345 features several horizontal channels 375 formed by corresponding ribs provided on the insulating body 350. The insulating body 350 further includes four alignment pins 380 and two wings 381. The wings 381 are used to increase the electrical contact between ground plane 370 and a corresponding ground plane of the male connector. The alignment pins 380 engage corresponding channels 375 of an adjacent module, whereas the wings 381 engage corresponding seats 383 formed in the front surface of the adjacent module between adjacent conductive forks 365. A stiffener 385 is stamped from a strip of metal and bent at a right angle, as shown. The stiffener 385 includes holes for mating with corresponding locking tabs 390 and is used to hold together the modules so as to provide increased strength and rigidity of the connector 330.

The VHDM connector 330 is assembled by stacking modules 335, 340, and 345 in a side-by-side orientation. The alignment pins 380 and wings 381 engage respective channels 375 and seats 383, so as to position the modules of the connector 330. The interference between these elements prevents each module from slipping off of the stack in a direction perpendicular to its longitudinal axis.

Figure 8:
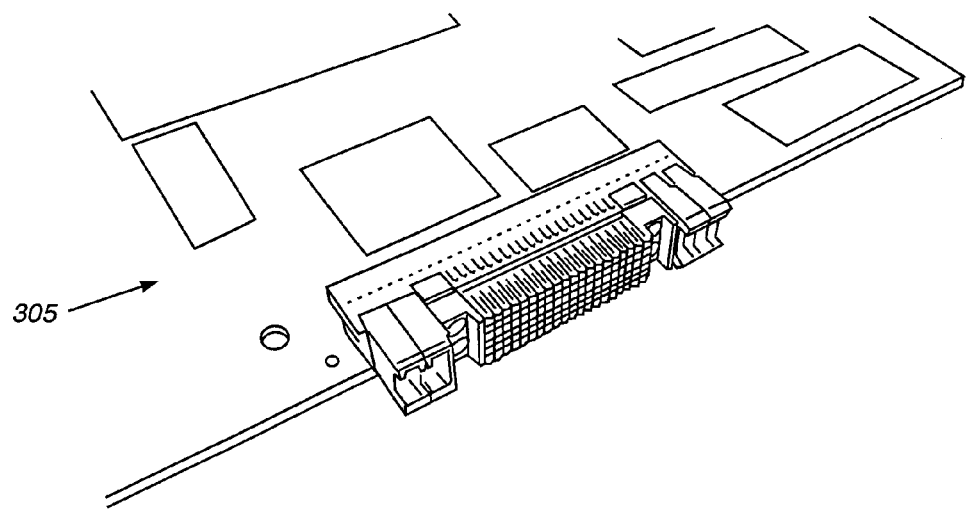
FIG. 8 is an elevational view of the VHDM connector of FIG. 3 press-fitted onto the front edge of an exemplary printed circuit board.

The VHDM connector 330 is press-fitted on the front edge of the circuit board 305, as shown in FIG. 8. Some modules are provided with a hole, which is coupled to corresponding guide pins on the circuit board 305 in order to align the connector 330 during positioning on the circuit board. Power modules are joined to corresponding power sockets, while at the same time the signal pins 355$s$ and the ground pins 355$g$ of each wafer module 345 are inserted into the corresponding signal holes 325$s$ and ground holes 325$g$, respectively, and held in place by friction.

As shown in FIG. 3, the VHDM connector 330 is used as an edge mounted connector. For example, the printed circuit board 305 can be a daughterboard, with the connector being used to mate the circuit board 305 to a backplane assembly that has a corresponding male connector. Alternatively, the printed circuit board 305 can be an extender card, with the connector then being used to mate the circuit board 305 to another circuit board. The use of the VHDM connector in other connection scenarios for a specific application are well within the ability of one of ordinary skill in the art.

Because the signal pins 355$s$ and the ground pins 355$g$ of each wafer module 345 and the corresponding signal holes 325$s$ and ground holes 325$g$ of the printed circuit board 105 are fixed, rewiring (or re-routing) a signal pathway conventionally involves a circuit board modification process that permanently alters the circuit board 105. However, embodiments of the present invention allow a signal pathway to be easily modified by removing a wafer module 345 from the VHDM connector 330 and modifying the wafer module 345, as shown in FIGS. 4-7 and described below.

Figure 4:
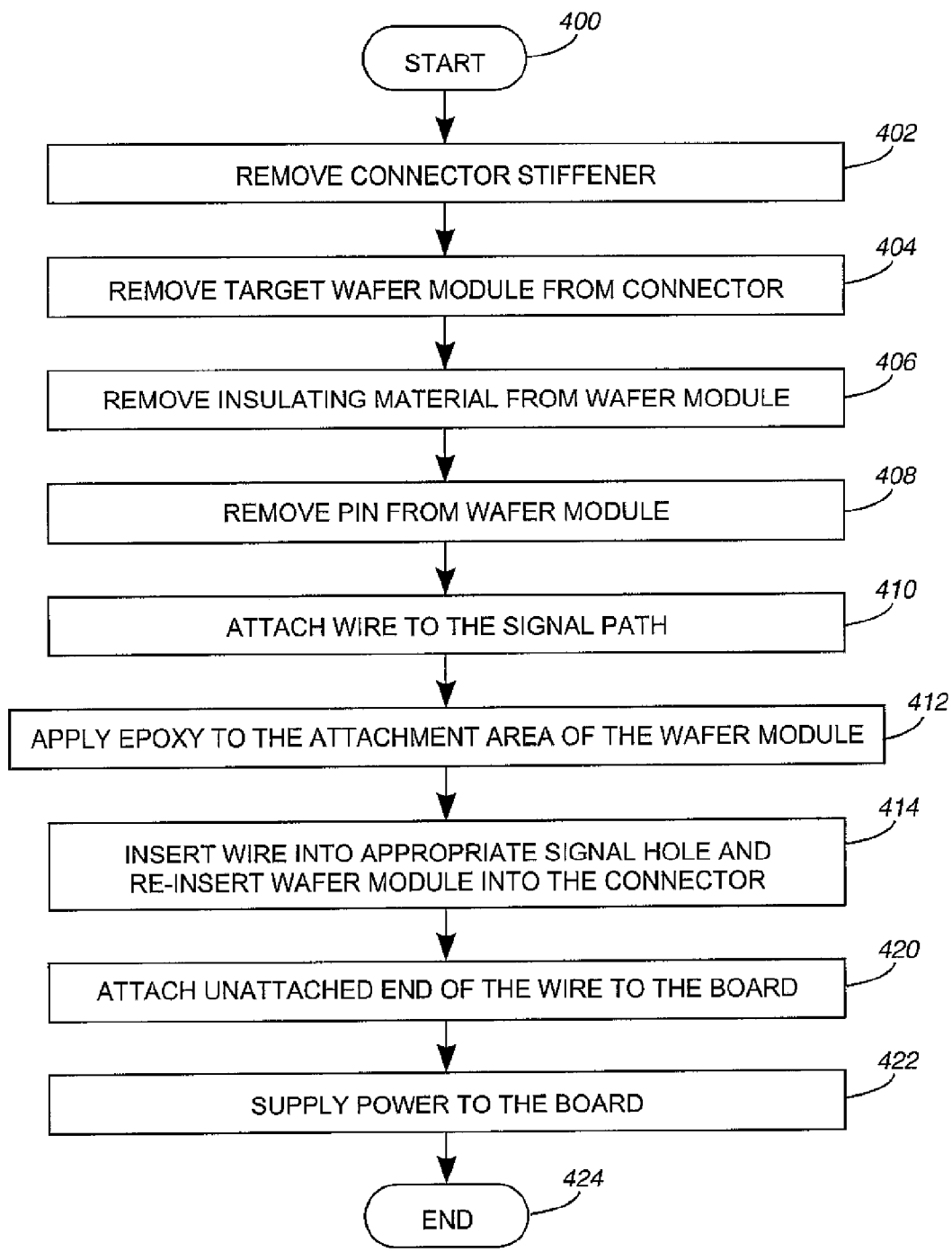
FIG. 4 is an operational flow diagram illustrating a signal pathway re-routing process according to one embodiment of the present invention.

FIG. 4 shows a process flow diagram illustrating a signal pathway re-routing process using wafer module modification according to one embodiment of the present invention. The flow of FIG. 4 starts at step 400 and moves directly to step 402, in which the connector stiffener 385 is removed from the VHDM connector 330. Next, in step 404, a wafer module 345 is removed from the connector 330 by sliding the wafer module out from the stack of modules. This produces an empty slot on the VHDM connector.

Figure 5:
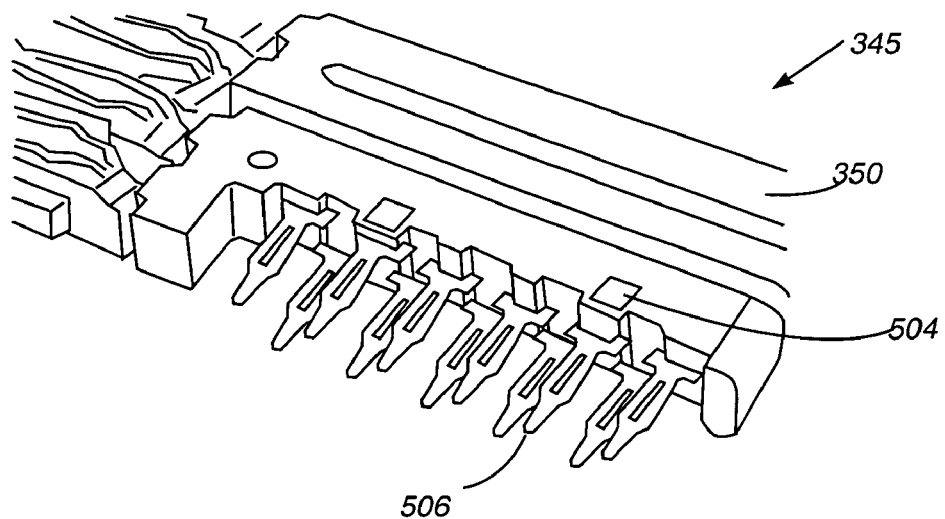
FIG. 5 is a close-up elevational view of a wafer module with its insulating material removed in accordance with an embodiment of the present invention.
Figure 6:
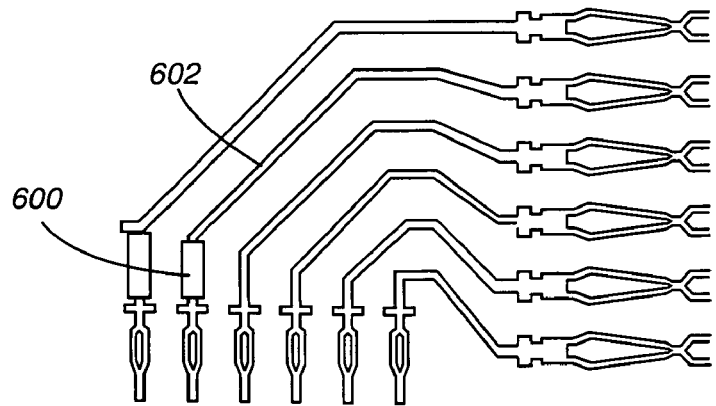
FIG. 6 is an x-ray view of the internal wiring of the wafer module of FIG. 5.

FIG. 5 shows a close-up side view of a single wafer module 345. This wafer module that is modified can be the wafer module that was removed from the VHDM connector, or a different (e.g., new) wafer module. The modification of the wafer module 345 in accordance with this embodiment begins in step 406. Insulating covering material 350 (usually plastic) is removed in an area 504 ("attachment area") above a signal pathway that is coupled to a signal pin 506, as shown in FIG. 5. This signal pathway is part of the signal pathway that is to be modified. The manner of removing the insulating covering material removal is unimportant as long as the conductor underneath is not damaged. For example, the insulating covering material can be removed by a small handgrind tool (such as a dremel), an end mill, a microchisel, or a laser. FIG. 6 shows an x-ray view of the internal wiring of the wafer module 345, which includes signal pathway 602. Area 600 denotes the attachment area of this signal pathway 602 within the wafer module that is exposed after step 406.

Figure 7:
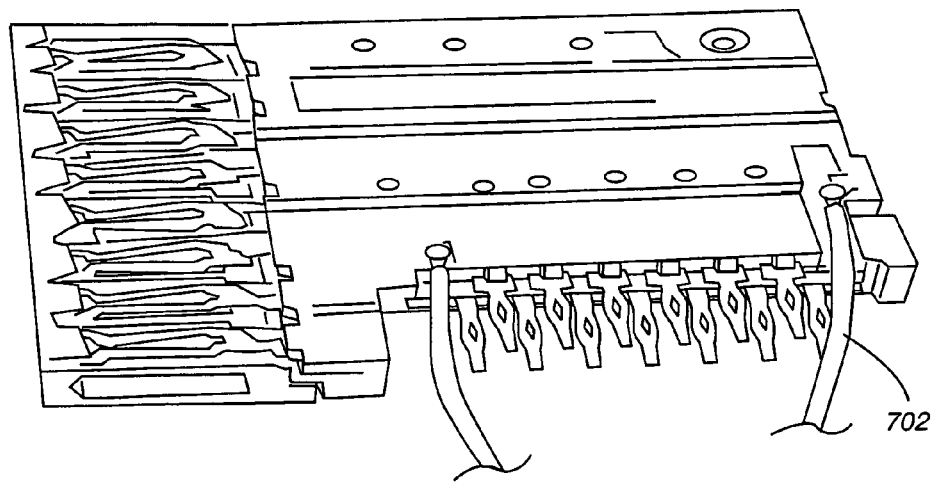
FIG. 7 is an elevational view of the wafer module of FIG. 5 with a wire electrically coupled to one of the signal pathways according to an embodiment of the present invention.

Next, in step 408, the pin 506 connected to the signal pathway that has been exposed is removed from the wafer module 345. The removal of the pin 506 prevents any contact between the exposed conductive signal pathway 602 and the corresponding signal hole 325s (i.e., through-hole) on the printed circuit board. In step 410, a wire 702 is attached (preferably with solder) to the exposed portion of the signal pathway 602 within the attachment area, as shown in FIG. 7. By attaching the wire 702 to the attachment area where the signal pathway 602 is exposed, the wire and the signal pathway are electrically connected. The wire 702 that is used has a diameter that is smaller than the diameter of the corresponding signal hole 325s in the circuit board 305 so that the wire 702 (including its insulation) can pass through this plated signal hole 325s. A thin layer of insulation (preferably in the form of quick-dry epoxy) is then applied in step 412 to the attachment area 504 of the wafer module 345. This will insure electrical isolation when the wafer module 345 is inserted into the VHDM connector 330. In further embodiments, other materials are used to provide some degree of electrical insulation for the signal pathway that was exposed in the attachment area.

Figure 9:
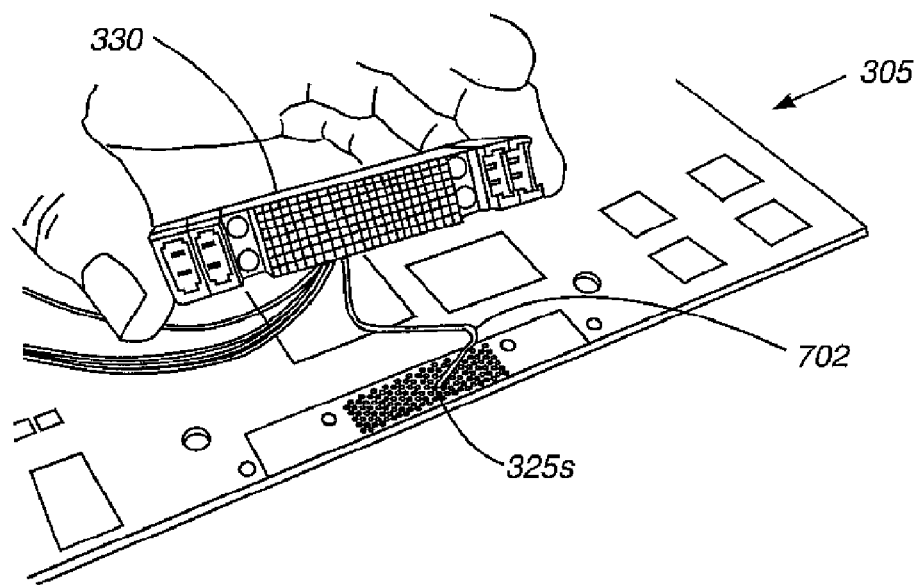
FIG. 9 is a top view of a printed circuit board showing a wire attached to the connector inserted into a signal hole on the circuit board according to an embodiment of the present invention.
Figure 10:
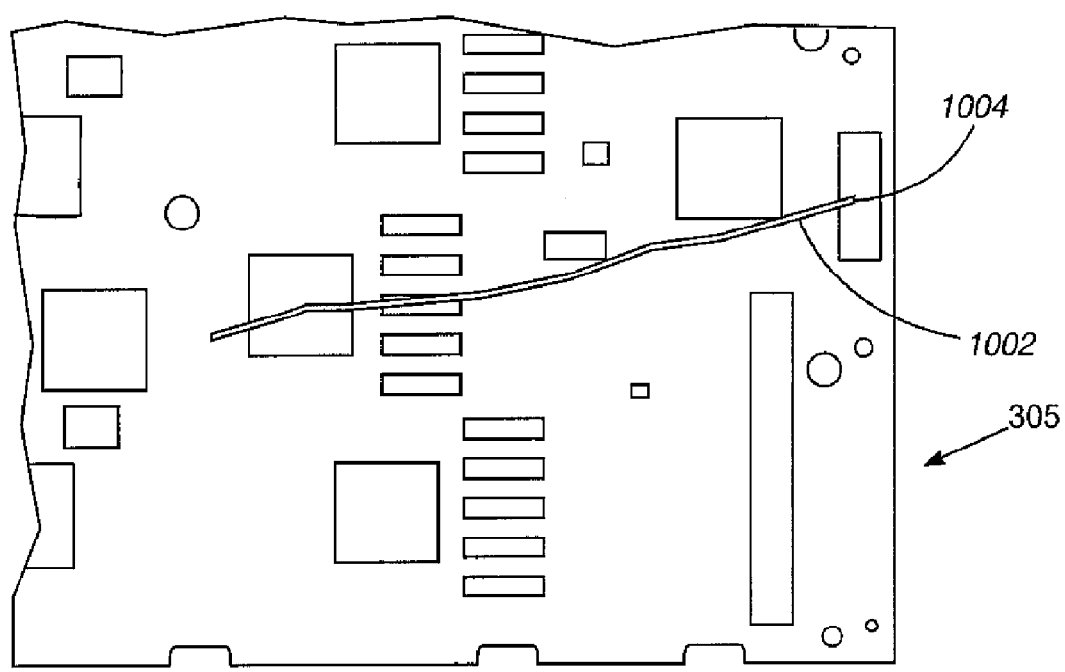
FIG. 10 is a bottom view of the printed circuit board of FIG. 9 showing the wire termination connection according to an embodiment of the present invention.

In step 414, the wire 702 is inserted into the appropriate signal hole 325s on the circuit board 305 so as to run through this through-hole, as shown in FIG. 9, and the VHDM connector 330 is reconstituted by inserting the modified wafer module 345 into the empty slot of the VHDM connector. The wafer modules 345 is pressed into place in the normal manner for wafer module replacement, except that care is taken to ensure that the wire 702 is routed through the signal through-hole 325s on the circuit board as the wafer module is pressed into place. In step 420, the unattached end 1002 (i.e., opposite end) of the wire 702 is connected to the desired area 1004 on the circuit board 305, as shown in FIG. 10. (Alternately, this end of the wire can be connected to another modified wafer module, as explained below.) The opposite end of the wire can be permanently attached to the circuit board (e.g., by soldering), or can be temporarily attached (e.g., by a removable adhesive, clip, or wire wrap). In step 422, power is supplied to the circuit board 305 and the signal pathway that includes conductive pathway 602 is now re-routed as compared with the circuit's original configuration. The process ends at step 424.

In optional further steps, the signal pathway modification can be reversed. This is very advantageous if the re-routing of the signal was performed only to allow testing of the circuit. In these additional steps, the modified wafer module is removed from the VHDM connector 330, for example by repeating steps 402 and 404. The removed wafer module is then replaced with a standard wafer module, and the wire is unattached from the printed circuit board. Alternatively, the removed wafer module can be reconfigured by removing the wire from the wafer module and the circuit board, and reattaching the pin that was removed. Either way, the signal re-routing is easily and quickly reversed to return the circuit to its original configuration.

In another embodiment of the present invention, the wire attached to the wafer module (that is used to reconfigure the signal pathway) is molded into the plastic housing of the wafer module at the time of manufacture. Such an embodiment allows a connector supplier to provide an additional type of connector having one or more signal pathways can be easily reconfigured using the methods described above. The molding of the wire into the plastic housing of the wafer module provides an "off the shelf" wafer module that designers could use to prototype their designs. Further, the metal lead frame that now contains the pin could be replaced by wires. Preferably, of the two rows on the wafer module (ground and signal), the ground pins are left alone to provide wafer retention to the board, while the signal side is replaced with wires during the manufacturing of the wafer module.

Accordingly, embodiments of the present invention provide methods for signal re-routing that are very advantageous as compared with conventional methods that require drilling plated thru-holes, cutting traces, jumpering traces, and other permanently-destructive methods of modifying circuit boards to re-route a signal pathway.

While the above description related to the modification of a single current path in a single wafer module of the connector, the present invention is not limited to the modification of a single current path on a wafer module or the modification of a single wafer module. The modification process of the present invention can be used to re-route multiple pathways on one wafer module, or one or more pathways on multiple wafer modules. In addition, in some embodiments of the present invention signal pathways on different wafer modules are coupled together (e.g., by attaching the opposite end of the wire to another modified wafer module of the same or a different electrical connector, instead of to the circuit board). Similarly, the present invention is also not limited to only the exemplary VHDM connector that is shown in the figures and described above. While particularly suited to press-fit connectors like VHDM connectors, any electrical connector with a similar structure can be modified through the process of the present invention to achieve similar advantageous results.

The terms "a" or "an", as used herein, are defined as one or more than one. The term "plurality", as used herein, is defined as two or more than two. The term "another", as used herein, is defined as at least a second or more. The terms "including" and/or "having", as used herein, are defined as comprising (i.e., open language). The term "coupled", as used herein, is defined as connected, although not necessarily directly.

Although specific embodiments of the invention have been disclosed, those having ordinary skill in the art will understand that changes can be made to the specific embodiments without departing from the spirit and scope of the invention. The scope of the invention is not to be restricted, therefore, to the specific embodiments, and it is intended that the appended claims cover any and all such applications, modifications, and embodiments within the scope of the present invention.

What is claimed is:

1. A method for modifying an electrical connector that is attached to a printed circuit board, the electrical connector including a plurality of wafer modules, the method comprising the steps of:

removing a covering material from an attachment area of a first wafer module, the attachment area being located above a signal pathway;

removing a connector pin of the first wafer module that is connected to the signal pathway, the connector pin corresponding to a through-hole on the printed circuit board;

attaching a first end of a wire to the attachment area of the first wafer module so as to electrically connect the wire and the signal pathway;

running the wire through the corresponding through-hole on the printed circuit board and inserting the first wafer module into an empty slot on the electrical connector; and electrically connecting a second end of the wire to the printed circuit board or another wafer module of the electrical connector.

2. The method according to claim 1, wherein the electrical connector is a very high density metric (VHDM) connector.

3. The method according to claim 1, further comprising the step of:
   before the step of removing a covering material, removing the first wafer module from the electrical connector.

4. The method according to claim 1, further comprising the step of removing a second wafer module from the electrical connector so as to produce the empty slot on the electrical connector.

5. The method according to claim 1, wherein the step of electrically connecting the second end of the wire to the printed circuit board comprises permanently attaching the second end of the wire to the printed circuit board.

6. The method according to claim 1, wherein the step of electrically connecting the second end of the wire to the printed circuit board comprises temporarily attaching the second end of the wire to the printed circuit board.

7. The method according to claim 1, further comprising the step of:
   after the running and electrically connecting steps, removing the first wafer module from the electrical connector and then inserting a second wafer module into the empty slot on the electrical connector so as to reverse the modification of the electrical connector.

8. The method according to claim 1, further comprising the step of:
   after the running and electrically connecting steps, removing the first wafer module from the electrical connector, removing the wire from the first wafer module, replacing the connector pin, and then re-inserting the first wafer module into the empty slot on the electrical connector so as to reverse the modification of the electrical connector.

9. The method according to claim 1, further comprising the step of:
   after attaching the first end of the wire to the attachment area, covering the attachment area with an insolating material.

10. The method according to claim 9, wherein the insulating material is an epoxy.

* * * * *